United States Patent
Tsujita

(10) Patent No.: US 8,963,547 B2
(45) Date of Patent: Feb. 24, 2015

(54) DETERMINATION OF SHIM COIL CURRENT VALUE FOR SHIMMING IN MAGNETIC RESONANCE IMAGING APPARATUS

(75) Inventor: Kazuhiko Tsujita, Otawara (JP)

(73) Assignees: Kabushiki Kaisha Toshiba, Minato-Ku, Tokyo (JP); Toshiba Medical Systems Corporation, Otawara-Shi, Tochigi (JP)

(*) Notice: Subject to any disclaimer, the term of this patent is extended or adjusted under 35 U.S.C. 154(b) by 423 days.

(21) Appl. No.: 13/403,245

(22) Filed: Feb. 23, 2012

(65) Prior Publication Data
US 2012/0217967 A1 Aug. 30, 2012

(30) Foreign Application Priority Data

Feb. 24, 2011 (JP) .................. 2011-038283
Feb. 17, 2012 (JP) .................. 2012-033111

(51) Int. Cl.
- *G01V 3/00* (2006.01)
- *G01R 33/3875* (2006.01)
- *G01R 33/54* (2006.01)
- *G01R 33/563* (2006.01)

(52) U.S. Cl.
CPC .......... *G01R 33/3875* (2013.01); *G01R 33/543* (2013.01); *G01R 33/56383* (2013.01)
USPC ...................................... 324/322

(58) Field of Classification Search
USPC ............................... 324/300–322
See application file for complete search history.

(56) References Cited

U.S. PATENT DOCUMENTS

| | | | | |
|---|---|---|---|---|
| 5,602,480 A * | 2/1997 | Onodera et al. | ............. | 324/320 |
| 6,294,972 B1 * | 9/2001 | Jesmanowicz et al. | ........ | 335/301 |
| 6,509,735 B2 * | 1/2003 | Mueller et al. | ................ | 324/307 |
| 6,687,526 B2 * | 2/2004 | Brand et al. | .................. | 600/410 |
| 7,292,034 B2 * | 11/2007 | Hennig et al. | ................ | 324/309 |
| 7,395,108 B2 * | 7/2008 | Roopchansingh et al. | ... | 600/410 |
| 7,414,401 B1 * | 8/2008 | Lvovsky | ........................ | 324/318 |

FOREIGN PATENT DOCUMENTS

| | | |
|---|---|---|
| JP | 08-191820 | 7/1996 |
| JP | 2002-165772 | 6/2002 |
| JP | 2004-73660 | 3/2004 |
| JP | 2007-209749 | 8/2007 |
| JP | 2007-301348 | 11/2007 |

* cited by examiner

*Primary Examiner* — Dixomara Vargas
(74) *Attorney, Agent, or Firm* — Nixon & Vanderhye PC

(57) ABSTRACT

In a magnetic resonance imaging apparatus according to an embodiment, a measuring unit moves a couchtop on which a subject is placed to at least one position of a plurality of positions in an imaging space, adjusts shim coil current value supplied to the shim coil, and measures first shim coil current value when a static magnetic field is uniformized. On the basis of the first shim coil current value and at least one of subject information and an imaging condition, a calculator calculates second shim coil current value position of the plurality of positions and at which the measuring unit has measured no shim coil current value.

20 Claims, 7 Drawing Sheets

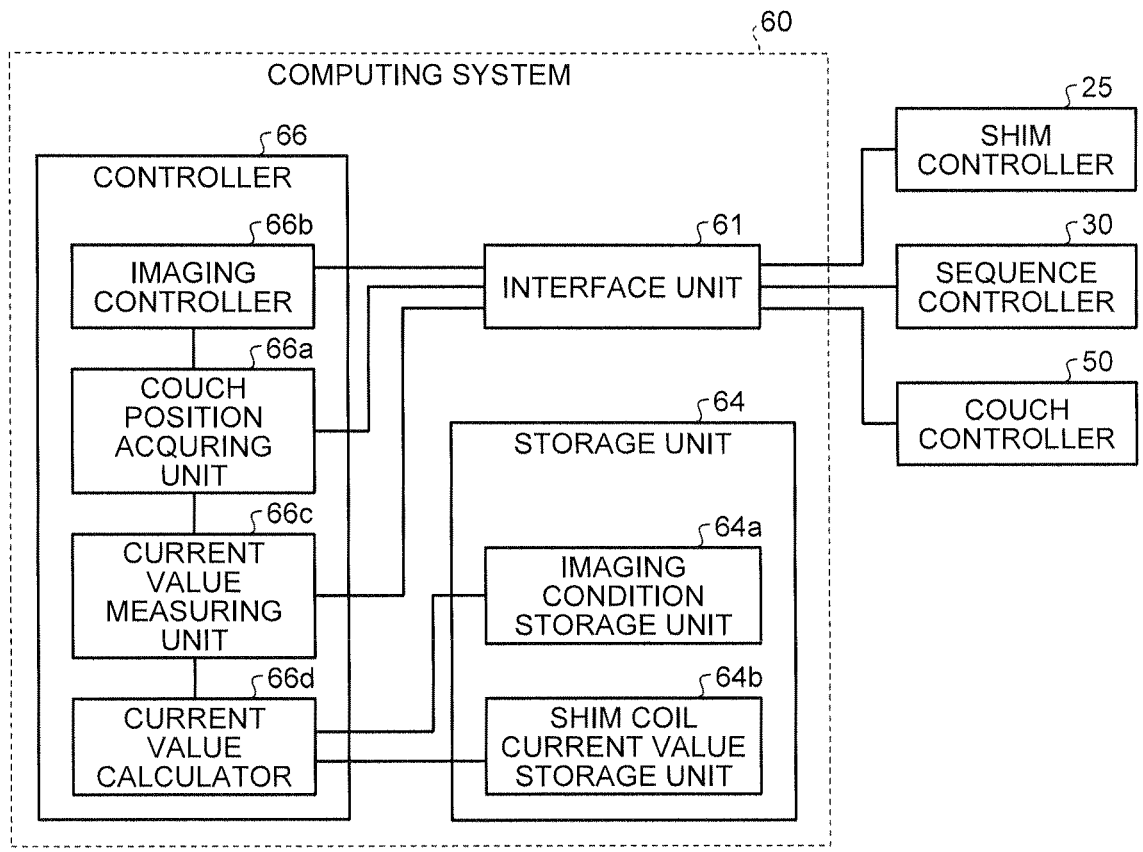

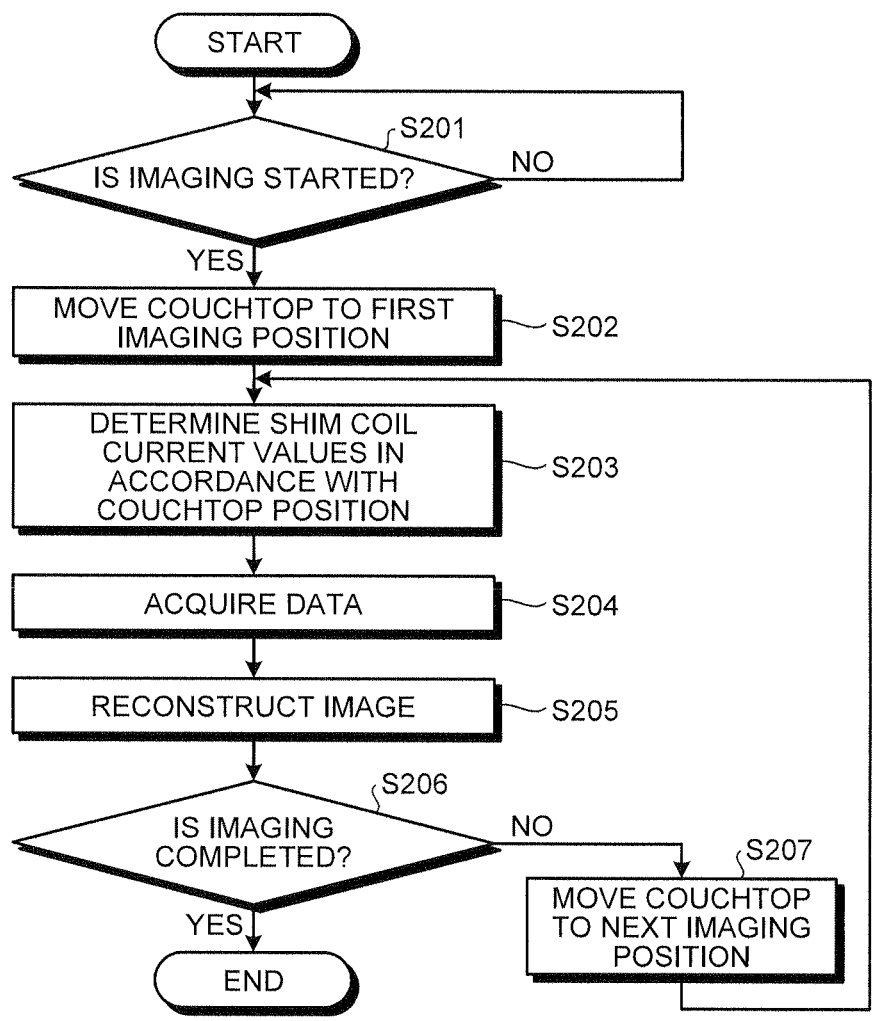

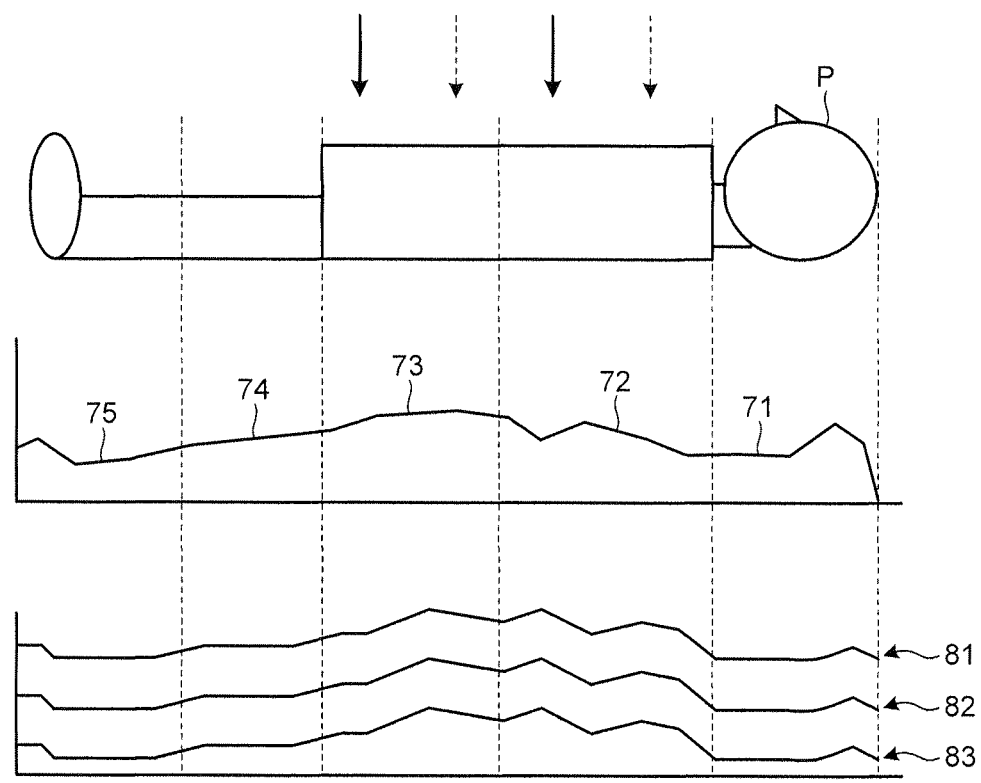

DETERMINATION OF SHIM COIL CURRENT VALUE FOR SHIMMING IN MAGNETIC RESONANCE IMAGING APPARATUS

CROSS-REFERENCE TO RELATED APPLICATIONS

This application is based upon and claims the benefit of priority from Japanese Patent Application No. 2011-038283, filed on Feb. 24, 2011; and Japanese Patent Application No. 2012-33111, filed on Feb. 17, 2012, the entire contents of both of which are incorporated herein by reference.

FIELD

Embodiments described herein relate generally to a magnetic resonance imaging apparatus.

BACKGROUND

In order to obtain good images with a magnetic resonance imaging apparatus, it is preferable to generate a uniform static magnetic field in the imaging space in which the subject (for example, patient) is placed. Various technologies for correcting non-uniformity in a static magnetic field are known. For example, an approach is known for making the static magnetic field in the imaging space uniform by arranging a ferromagnet, such as an iron shim, in a static magnetic field generated by a static magnetic field magnet. Another example is an approach known in which a shim coil is used. In this approach, the shim coil generates a correction magnetic field for correcting the non-uniformity of a static magnetic field and the correction magnetic field is superimposed on the static magnetic field so that the static magnetic field in the imaging space is uniformized.

As well as making static magnetic fields uniform, there has been a trend in recent years to shorten the shaft length of the static magnetic field magnet of an MRI apparatus so that the subject does not feel claustrophobic and to inhibit an increase of dB/dt (change in the amplitude of the gradient magnetic field per unit of time) caused by an increase in the gradient magnetic field amplitude. This narrows the area that can be imaged along the direction of the body axis. For this reason, when an area wide along the direction of the body axis of a subject is imaged, e.g., when the spine is imaged, the area to be imaged is segmented and imaged while moving the subject in the direction of the body axis.

As described above, when imaging is performed while moving the subject, the anatomy positioned in the imaging space changes. It is known that uniformity of a static magnetic field in an imaging space changes depending on the anatomy positioned in the imaging space. Thus, the above-described correction of non-uniformity of the static magnetic field is performed every time the subject is moved, which sometimes extends the time taken to perform the entire imaging.

BRIEF DESCRIPTION OF THE DRAWINGS

FIG. 3 is a functional block diagram of a configuration of a computing system shown in FIG. 1;

FIG. 4 is a table of exemplary information stored in a shim coil current value storage unit according to the embodiment;

FIG. 7 is a flowchart of operations of the MRI apparatus to image a subject according to the embodiment; and FIG. 8 is a diagram illustrating a method of calculating shim coil current values performed by a current value calculator according to the embodiment.

DETAILED DESCRIPTION

According to one embodiment, a magnetic resonance imaging apparatus includes a static magnetic field generator, a shim coil unit, a measuring unit, a calculator, and a controller. The static magnetic field generator generates a static magnetic field in an imaging space. The shim coil unit generates a correction magnetic field that corrects non-uniformity of the static magnetic field. Before imaging, the measuring unit moves a couchtop on which a subject is placed to at least one position of a plurality of positions in the imaging space, adjust shim coil current value supplied to the shim coil, and measures first shim coil current value when the static magnetic field is uniformized. On the basis of the first shim coil current value and at least one of subject information and an imaging condition, the calculator calculates second shim coil current value at one of the plurality of positions and at which the measuring unit has measured no shim coil current value. The controller performs imaging while uniformizing the static magnetic field at each position of the couchtop by supplying the shim coil unit with one of the first shim coil current value and the second shim coil current value corresponding to the position of the couchtop.

Figure 1:
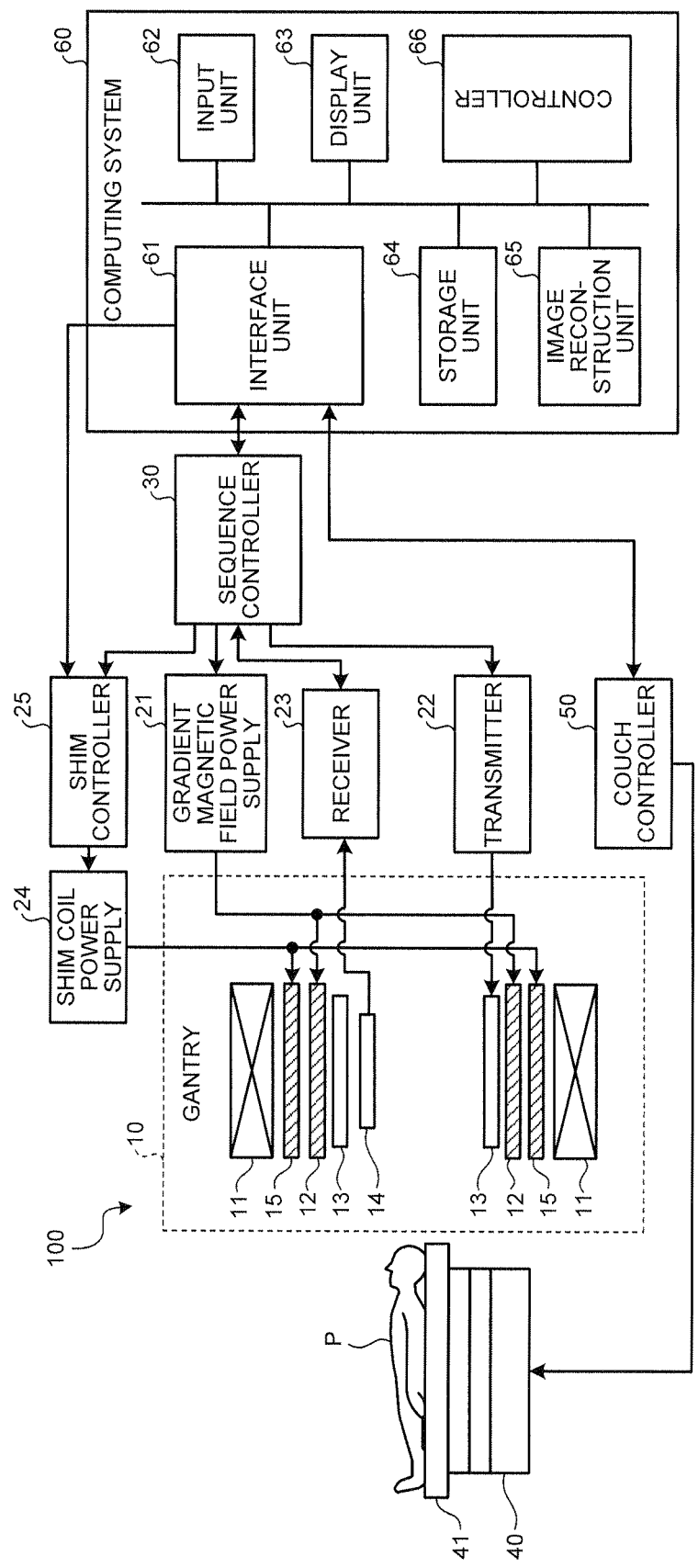
FIG. 1 is a diagram of a magnetic resonance imaging (MRI) apparatus according to an embodiment.

A configuration of the MRI apparatus according to the embodiment will be described here. FIG. 1 is a diagram of the configuration of an MRI apparatus 100 according to the embodiment. As shown in FIG. 1, the MRI apparatus 100 includes a gantry 10, a gradient magnetic field power supply 21, a transmitter 22, a receiver 23, a shim coil power supply 24, a shim controller 25, a sequence controller 30, a couch 40, a couch controller 50, and a computing system 60.

The gantry 10 applies a high-frequency magnetic field to a subject P lying in a static magnetic field and acquires MR signals emitted from the subject P. For example, the gantry 10 includes a static magnetic field magnet 11, a gradient coil 12, a transmitting radio frequency (RF) coil 13, a receiving RF coil 14, and a shim coil unit 15.

The static magnetic field magnet 11 is formed as a hollow cylindrical shape. For example, a permanent magnet or a superconducting magnet is used as the static magnetic field magnet 11.

The gradient coil 12 is formed as a hollow cylindrical shape. The gradient coil 12 is arranged on the inner side with respect to the static magnetic field magnet 11. The gradient coil 12 includes three coils corresponding to the X, Y, and Z axes, which are orthogonal to one another. The coils are supplied with currents from the gradient magnetic field power supply 21 described below and generate gradient magnetic fields whose magnetic field amplitudes change along the X, Y, and Z axes. The Z-axis is in the same direction as that of the static magnetic field.

The gradient magnetic fields of the X, Y, and Z axes generated by the gradient coil 12 correspond to, for example, a slice selection gradient magnetic field Gs, a phase encode gradient magnetic field Ge, and a read-out gradient magnetic field Gr, respectively. The slice selection gradient magnetic field Gs is used to arbitrarily determine an imaging cross-section. The phase encode gradient magnetic field Ge is used to change the phase of an echo signal (MR signal) in accordance with the spatial position. The read-out gradient magnetic field Gr is used to change the frequency of the echo signal in accordance with the spatial position.

The transmitting RF coil 13 is arranged on the inner side With respect to the gradient coil 12. The transmitting RF coil 13 is supplied with a high-frequency pulse from the transmitter 22 and generates a high-frequency magnetic field.

The receiving RF coil 14 is arranged on the inner side with respect to the gradient coil 12. The receiving RF coil 14 receives an echo signal emitted from the subject P due to the effect of the high-frequency magnetic field generated by the transmitting RF coil 13. The receiving RF coil 14 outputs the received echo signal to the receiver 23.

The shim coil unit 15 generates a correction magnetic field that corrects non-uniformity of the static magnetic field generated by the static magnetic field magnet 11. The shim coil unit 15 is tightly joined to the outer periphery of the gradient coil 12. Generally, non-uniformity of a static magnetic field is categorized into its components, e.g., zero-order components $X^0$, $Y^0$ and $Z^0$, second-order components $X^2$, $Y^2$, $Z^2$, XY, ZY, ZX etc., and then represented by these components. There are also higher-order components of a third order or higher. Correction of non-uniformity of he static magnetic field is generally performed for each component.

Figure 2:
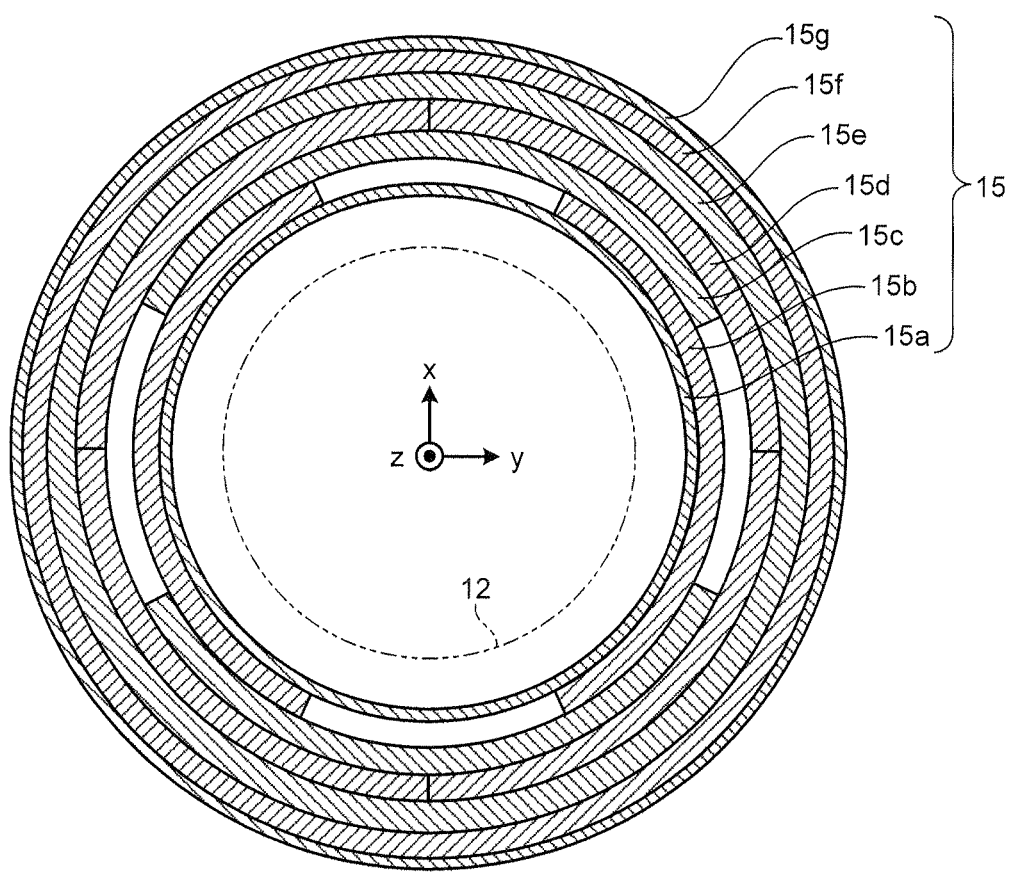
FIG. 2 is a cross-sectional view of a shim coil unit shown in FIG. 1 and viewed in the axial direction.

In the embodiment, the shim coil unit 15 has a second-order shim coil structure and generates 5-channel correction magnetic fields that correct the second-order components ZX, ZY, XY, $X^2$-$Y^2$, and $Z^2$. FIG. 2 is a cross-sectional view of the shim coil unit 15 shown in FIG. 1 viewed in its axial direction.

As shown in FIG. 2, the shim coil unit 15 includes an inner resin layer 15a, shim coils 15b to 15f, and a resin tape layer 15g. The inner resin layer 15a is formed so as to have a cylindrical shape on the gradient coil 12. Each of the shim coils 15b to 15f is formed so as to form a required coil pattern by, for example, arranging a flexible substrate on an insulating base.

The shim coil 15b is arranged on the outer circumference of the inner resin layer 15a. The shim coil 15b generates a magnetic field having a magnetic field direction almost the same as that of the ZX component of the static magnetic field generated by the static magnetic field magnet 11. The shim coil 15c is arranged on the outer circumference of the shim coil 15b. The shim coil 15c generates a magnetic field having a magnetic field direction almost the same as that of the ZY component of the static magnetic field generated by the static magnetic field magnet 11. The shim coil 15d is arranged on the outer circumference of the shim coil 15c. The shim coil 15d generates a magnetic field having a magnetic field direction almost the same as that of the XY component of the static magnetic field generated by the static magnetic field magnet 11.

The shim coil 15e is arranged on the outer circumference of the shim coil 15d. The shim coil 15e generates a magnetic field having a magnetic field direction almost the same as that of the $X^2$-$X^2$ component of the static magnetic field generated by the static magnetic field magnet 11. The shim coil 15f is arranged on the outer circumference of the shim coil 15e. The shim coil 15e generates a magnetic field having a magnetic field direction almost the same as that of the $Z^2$ component of the static magnetic field generated by the static magnetic field magnet 11. The resin tape layer 15g is formed by winding a resin tape around the outer circumference of the shim coil 15f. The resin tape layer 15g protects and insulates the shim coils 15b to 15f.

Such a configuration allows the shim coil unit 15 to generate 5-channel correction magnetic fields upon being supplied with a current from the shim coil power supply 24 described below. Alternatively, a shim coil unit including a larger number of shim coils may be used that generates, for example, 13-channel or 18-channel correction magnetic fields.

The shim coil power supply 24 supplies each of the shim coils 15b to 15f of the shim coil unit 15 with a current independently under the control of the shim coil power supply 24.

The shim controller 25 controls the shim coil power supply 24 under the control of the computing system 60. Specifically, the shim controller 25 receives shim coil current values determined by the computing system 60 for the respective shim coils and controls the shim coil power supply 24 such that it supplies received shim coil current values to the shim coils 15b to 15f.

The following section refers back to the description of FIG. 1. The gradient magnetic field power supply 21 supplies the gradient coil 12 with a current. The transmitter 22 transmits a high-frequency pulse corresponding to a Larmor frequency to the transmitting RF coil 13. The receiver 23 generates MR signal data by digitizing the MR signal that is output from the receiving RF coil 14 and transmits the generated MR signal data to the sequence controller 30.

The sequence controller 30 scans the subject P by driving the gradient magnetic field power supply 21, the transmitter 22, and the receiver 23 in accordance with the sequence information transmitted from the computing system 60. When the subject P is scanned and the MR signal data then transmitted by the receiver 23, the sequence controller 30 transfers the MR signal data to the computing system 60.

The sequence information is information defining the scanning procedure, i.e., the magnitude of the power that the sequence controller 30 supplies to the gradient coil 12, the timing with which the power is supplied, the magnitude of the RF signal that the transmitter 22 transmits to the transmitting RF coil 13, the timing with which the RF signal is transmitted, and the timing with which the receiver 23 detects the echo signal.

The couch 40 includes a couchtop 41 on which the subject P lies. The couch 40 inserts the couchtop 41 with the subject P thereon into an opening in the gantry 10. The couch 40 is arranged such that its longitudinal direction is parallel to the center axis of the static magnetic field magnet 11.

The couch controller 50 drives the couch 40 under the control of the computing system 60 and moves the couchtop 41 in the longitudinal and vertical directions. The couch controller 50 transmits positional information indicating the position of the couchtop 41 to the computing system 60 each time the couch controller 50 moves the couchtop 41.

The computing system 60 is an apparatus that controls the whole MRI apparatus 100, collects data, and reconstructs the images. The computing system 60 includes, for example, an interface unit 61, an input unit 62, a display unit 63, a storage unit 64, an image reconstruction unit 65, and a controller 66.

The interface unit 61 controls input/output of various signals communicated between the interface unit 61 and the sequence controller 30. For example, the interface unit 61 transmits sequence information to the sequence controller 30 and receives MR signal data from the sequence controller 30. Upon receiving MR signal data, the interface unit 61 stores the received MR signal data in the storage unit 64 for each subject P.

The input unit 62 receives various instructions and information input from an operator. For example, the input unit 62 receives a setting of imaging conditions from the operator. For the input unit 62, for example, a pointing device, such as a mouse or a tack ball, a selecting device, such as a mode switch, or an input device, such as a keyboard, is used.

The display unit 63 displays various images referred to by the operator and a graphical user interface (GUI) for receiving various operations from the operator. For the display unit 63, for example, a display device, such as a liquid crystal monitor or a CRT monitor, is used.

The storage unit 64 stores, for each subject P, MR signal data transmitted from the sequence controller 30 and image data generated by the image reconstruction unit 65, which is described below. The information stored by the storage unit 64 will be described in detail below.

The image reconstruction unit 65 generates image data representing the inside of subject P by performing a post-process, i.e., a reconstruction process such as a Fourier conversion process, on the MR signal data stored in the storage unit 64.

The controller 66 controls the whole MRI apparatus 100 by controlling transitions between the above-described functional units and receiving and passing data between the functional units and the storage unit. The controller 66 includes a central processing unit (CPU) and a memory. The controller 66 controls each unit of the MRI apparatus 100 by executing various programs using the CPU and the memory. For example, the controller 66 generates sequence information on the basis of the imaging conditions set by the operator and performs various types of imaging by transmitting the generated sequence information to the sequence controller 30.

The configuration of the MRI apparatus 100 according to the embodiment is described above. With such a configuration, the MRI apparatus 100, before imaging, moves the couchtop 41 to at least one position of a plurality of positions and measures shim coil current values when the static magnetic field is uniformized by adjusting the shim coil current values to be supplied to the shim coil unit 15. On the basis of the measured shim coil current values, the MRI apparatus 100 calculates shim coil current values corresponding to, from among the plurality of positions, positions where no shim coil current value has been calculated. The MRI apparatus 100 performs imaging while uniformizing a static magnetic field at each position of the couchtop 41 by, while moving the couchtop 41 to a plurality of positions, supplying the shim coil unit 15 with, from among the measured shim coil current values and the calculated shim coil current values, currents of shim coil current values corresponding to the position of the couchtop 41.

In other words, according to the embodiment, when shim coil current values are measured at least one position in the imaging space, the shim coil current values regarding another position can be interpolated according to the measured shim coil current values. Thus, it is not necessary to measure shim coil current values at all positions to which the couchtop is moved during imaging. Accordingly, in the embodiment, when performing imaging while moving the subject, it is possible to correct non-uniformity of the static magnetic field and shorten the time taken for imaging.

The configuration of the MRI apparatus 100 according to the embodiment will be described in detail here. The main description will be of the configuration of the computing system 60 shown in FIG. 1. FIG. 3 is a functional block diagram of the configuration of the computing system 60 shown in FIG. 1. FIG. 3 shows the interface unit 61, the storage unit 64, and the controller 66 among the functional units of the computing system 60 and does not show other functional units.

As shown in FIG. 3, the storage unit 64 includes an imaging condition storage unit 64a and a shim coil current value storage unit 64b.

The imaging condition storage unit 64a stores imaging conditions received from the operator via the input unit 62. For example, the imaging condition storage unit 64a categorizes and stores imaging conditions for each anatomy to be imaged. The anatomies are, for example, "head", "chest", and "lower extremity". The imaging conditions stored in the imaging condition storage unit 64a are, for example, the weight and height of the subject P and information representing the posture of the subject P and the direction in which the subject P is inserted into the imaging space during imaging. The information representing the posture includes, for example, "supine (face-up)", "prone (face-down)", "decubitus right", and "decubitus left". The information representing the insertion direction includes, for example, "insertion from the head" and "insertion from the legs".

When an area wide along the body axis of the subject P is imaged, e.g., when the imaging anatomy is the spine, the area to be imaged is divided and imaged while moving the subject P in the body-axis direction. In this case, the imaging conditions include the number of times and distance the couchtop 41 is moved. The number of times and distance the couchtop 41 is moved are automatically calculated by the controller 66 in accordance with the size of the imaging area and the imaged anatomy. The number of times and distance the couchtop 41 is moved may be identified by the operator.

The shim coil current value storage unit 64b stores shim coil current values corresponding to the positions of the couchtop. FIG. 4 is a table of exemplary information stored in the shim coil current value storage unit 64b according to the embodiment. Each of Z1, Zx1, Z2, Zx2, and Z3 in FIG. 4 denotes positional information representing the position of the couchtop 41 (table position) along the Z-axis direction. Each of XY, $X^2$-$Y^2$, ZX, ZY, and $Z^2$ denotes information representing a channel (shim channel) of a shim coil.

As shown in FIG. 4, the shim coil current value storage unit 64b stores shim coil current values supplied to each shim channel for each position to which the couchtop 41 is moved. For example, the example shown in FIG. 4 represents that, when the position of the couchtop 41 is Z1, a current of a current value A11 is supplied to the XY-channel shim coil 15d, a current of a current value A12 is supplied to the $X^2$-$Y^2$ channel shim coil 15e, a current of a current value A13 is supplied to the shim coil 15b of the ZX channel, a current of a current value A14 is supplied to the ZY-channel shim coil 15c, and a current of a current value A15 is supplied to the $Z^2$-channel shim coil 15f.

The following section refers back to the description of FIG. 3. The controller 66 includes a couch position acquiring unit 66a, an imaging controller 66b, a current value measuring unit 66c, and a current value calculator 66d.

The couch position acquiring unit 66a acquires the positional information on the couchtop 41 transmitted from the couch controller 50 and stores the obtained positional information in, for example, an internal memory.

The current value measuring unit 66c, before imaging, moves the couchtop 41 on which the subject P lies to at least one position of the plurality of positions in the imaging space and measures shim coil current values at the time when the static magnetic field is uniformized by adjusting the shim coil current values to be supplied to the shim coil unit 15.

Specifically, when an area wide along the body axis of the subject P is measured, the current value measuring unit 66c calculates a plurality of imaging positions representing positions along the Z-axis direction to which the couchtop 41 is moved during imaging on the basis of the number of times and distance the couchtop 41 is moved that are included in the imaging conditions. The current value measuring unit 66c then chooses at least one position of the calculated positions and determines the chosen position as a position at which shim coil current values are measured. The current value measuring unit 66c controls the couch controller 50 and measures shim coil current values while moving the couchtop 41 to the determined measurement position.

Figure 5A:
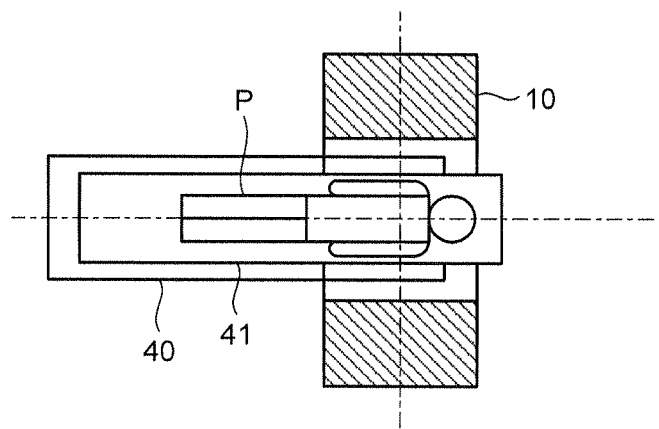
FIGS. 5A, 5B, and 5C are diagrams of exemplary shim coil current value measurement performed by a current value measuring unit according to the embodiment.
Figure 5B:
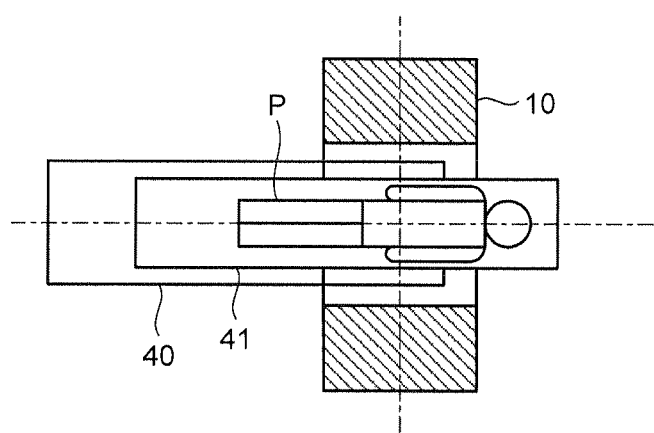
Figure 5C:
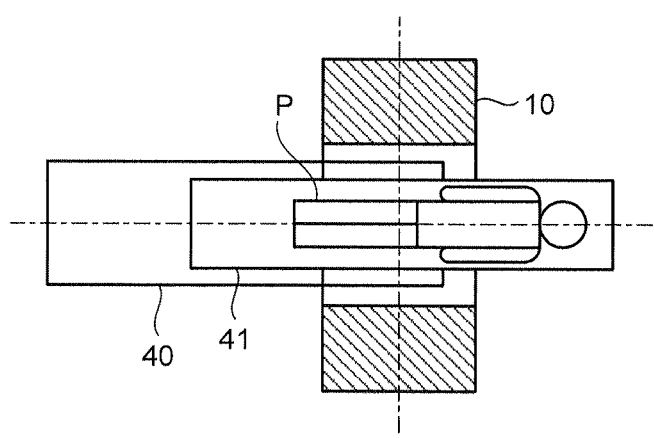

FIGS. 5A, 5B, and 5C are diagrams of exemplary shim coil current value measurement performed by the current value measuring unit 66c according to the embodiment. As shown in FIGS. 5A, 5B, and 5C, for example, when the anatomy from the chest to the thigh of the subject P is imaged, the current value measuring unit 66c gradually moves the couchtop 41 to a position where the chest of the subject P is positioned at the center of the magnetic field, to a position where the abdomen of the subject P is positioned at the center of the magnetic field, and to a position where the thigh of the subject P is positioned at the center of the magnetic field.

The current value measuring unit 66c controls the shim controller 25 such that it adjusts the shim coil current values to be supplied from the shim coil power supply 24 to the shim coil unit 15 at each position to which the couchtop 41 is moved, thereby uniformizing the static magnetic field. When the current value measuring unit 66c uniformizes the static magnetic field, it measures shim coil current values at that time.

Known various approaches may be used for the method of uniformizing a static magnetic field. For example, after obtaining a magnetic field distribution as a spatial phase map, the current value measuring unit 66c resolves the magnetic field distribution for each magnetic field component and obtains, for each shim coil, shim coil current values required to obtain magnetic field amplitude with which a stable magnetic distribution is obtained for each magnetic field component.

Each time the current value measuring unit 66c measures shim coil current values when the static magnetic field is uniformized, the current value measuring unit 66c acquires positional information on the couchtop 41 from the couch position acquiring unit 66a and stores the information that associates the acquired position information and the measured shim coil values in the shim coil current value storage unit 64b.

For example, if it is assumed that that the positional information of the couchtop 41 in FIG. 5A is Z1, the positional information of the couchtop 41 in FIG. 5B is Z2, and the positional information of the couchtop 41 in FIG. 5C is Z3, then, in this case, as shown in FIG. 4, the current value measuring unit 66c stores, in the shim coil current value storage unit 64b, information associating the positional information Z1 on the couchtop 41 with the shim coil current values A11 to A15 of the XY, $X^2$-$Y^2$, ZX, ZY and $Z^2$ channels. As shown in FIG. 4, the current value measuring unit 66c also stores, in the shim coil current value storage unit 64b, the information associating the positional information Z2 on the couchtop 41 with the shim coil current values A21 to A25 of the XY, $X^2$-$Y^2$, ZX, ZY and $Z^2$ channels. As shown in FIG. 4, the current value measuring unit 66c also stores, in the shim coil current value storage unit 64b, the information associating the positional information Z3 on the couchtop 41 with the shim coil current values A31 to A35 of the XY, $X^2$-$Y^2$, ZX, ZY and $Z^2$ channels.

The following section refers back to the description of FIG. 3. On the basis of the shim coil current values measured by the current value measuring unit 66c, the current value calculator 66d calculates shim coil current values corresponding to a position where no shim coil current value has been measured by the current value measuring unit 66c from among the plurality of positions.

Specifically, the current value calculator 66d refers to the shim coil current values stored in the shim coil current value storage unit 64b and calculates shim coil current values at imaging positions where the measurement has not been performed. Here, for example, when the current value measuring unit 66c calculates shim coil current values at two or more measuring positions, the current value calculator 66d calculates shim coil current values at an imaging position between two adjacent measurement positions by using the shim coil current values at the two adjacent measurement positions.

For example, if it is assumed that, from among the shim coil current values shown in FIG. 4, the shim coil current values corresponding to the position information Z, Z2, and Z3 on the couchtop 41 are already stored in the shim coil current value storage unit 64b, then, in this case, the current value calculator 66d calculates shim coil current values Ax11 to Ax15 of the respective shim channels regarding the imaging position Zx1 between the measurement position denoted by Z1 and the measurement position denoted by Z2 and stores the shim coil current values Ax11 to Ax15 in the shim coil current value storage unit 64b. Furthermore, the current value calculator 66d also calculates shim coil current values Ax21 to Ax25 of the respective shim channels regarding the imaging position Zx2 between the measurement position denoted by Z2 and the measurement position denoted by Z3 and stores the shim coil current values Ax21 to Ax25 in the shim coil current value storage unit 64b. In this manner, according to the shim coil values measured by the current value measuring unit 66c, shim coil current values regarding positions where no measurement has been performed are interpolated.

Various approaches can be used as the method of calculating shim coil current values regarding a position where no measurement has been performed. For example, the current value calculator 66d calculates intermediate values of the shim coil current values regarding two adjacent measurement positions and sets the calculated intermediate values as shim coil current values at the imaging position where no measurement has been performed between the two measurement positions.

Alternatively, for example, the current value calculator 66d may calculate shim coil current values by using a correction function defined in accordance with an anatomy to be imaged. In this case, the current value calculator 66d refers to the imaging condition storage unit 64a and identifies the anatomy to be imaged. Because the property, volume, etc. of the anatomy contained in an imaging target are different between, for example, a case where the lower extremity of the subject P is imaged and a case where the anatomy from the chest to the abdomen is imaged, the change in non-uniformity of the static magnetic field caused when the couchtop 41 is moved in the direction of the body axis of the subject P also differs. Thus, using a different correction function depending on the anatomy to be imaged makes it possible to appropriately uniformize the static magnetic field while moving the subject. The correction functions used here are pre-stored in the storage unit 64 in association with each anatomy to be imaged.

The current value calculator 66d may calculate shim coil current values by using a correction function defined in accordance with the weight and height of the subject P. In this case, the current value calculator 66d refers to the imaging condition storage unit 64a and identifies the weight and height of the subject P. If the weight and height of the subject P are different, the build of the subject differs accordingly. Thus, the change in non-uniformity of the static magnetic field caused when the couchtop 41 is moved along the direction of the body axis of the subject P differs. For this reason, using a different correction function depending on the weight and height of the subject P makes it possible to appropriately uniformize the static magnetic field while moving the subject. The correction functions used here are pre-stored in the storage unit 64 in association with the weight and height.

The current value calculator 66d may calculate shim coil current values by using a correction function defined in accordance with the posture of the subject P and the direction in which the subject P is inserted into the imaging space during imaging. In this case, the current value calculator 66d refers to the imaging condition storage unit 64a and identifies the posture of the subject P and the direction in which the subject P is inserted into the imaging space. If the posture of the subject P and the direction in which the subject P is inserted into the imaging space during imaging are different, the change in non-uniformity of the static magnetic field caused when the couchtop 41 is moved in the direction of the body axis of the subject P differs accordingly. Accordingly, using a different correction function depending on the posture of the subject P and the direction in which the subject P is inserted makes it possible to appropriately uniformizing the static magnetic field while moving the subject. The correction functions used here are pre-stored in the storage unit 64 in association with the posture and insertion direction.

As described above, when the current value calculator 66d calculates shim coil current values by using the pre-defined correction functions, it is satisfactory if the current value measuring unit 66c measures shim coil current values regarding at least one position. This further shortens the time taken for the whole imaging.

The following section refers back to the description of FIG. 3. The imaging controller 66b performs various types of imaging by generating sequence information on the basis of the imaging conditions set by the operator and transmitting the generated sequence information to the sequence controller 30.

In the embodiment, the imaging controller 66b performs imaging while uniformizing the static magnetic field at each position of the couchtop 41 by, while moving the couchtop 41 to a plurality of positions, supplying the shim coil unit 15 with, from among the measured shim coil current values and the calculated shim coil current values, shim coil current values corresponding to the position of the couchtop 41.

Specifically, when an area wide along the direction of the body axis of the subject P is imaged, the imaging controller 66b calculates a plurality of imaging positions representing positions along the Z-axis direction to which the couchtop 41 is moved on the basis of the number of times and distance the couchtop 41 is moved, which are included in the imaging conditions. The imaging positions calculated here are the same as the imaging positions calculated by the above-described current value measuring unit 66c.

The imaging controller 66b then controls the couch controller 50 so as to image the subject P while moving the couchtop 41 to the calculated imaging positions. The imaging controller 66b, before imaging, acquires position information on the couchtop 41 from the couch position acquiring unit 66a each time the couchtop 41 is moved to an imaging position. The imaging controller 66b refers to the shim coil current values stored in the shim coil current value storage unit 64b and determines shim coil current values of each shim channel corresponding to the acquired position information on the couchtop 41. The imaging controller 66b instructs the shim controller 25 to supply the shim coil unit 15 with the determined shim coil value. Accordingly, imaging is performed while uniformizing the static magnetic field at each position of the couchtop 41.

Operations of the MRI apparatus 100 according to the embodiment will be described here. Operations to measure shim coil current values and operations to image the subject P are described regarding the case where imaging is performed while the couchtop is moved to a plurality of positions. Measurement of a shim coil value is performed before the subject P is imaged.

Figure 6:
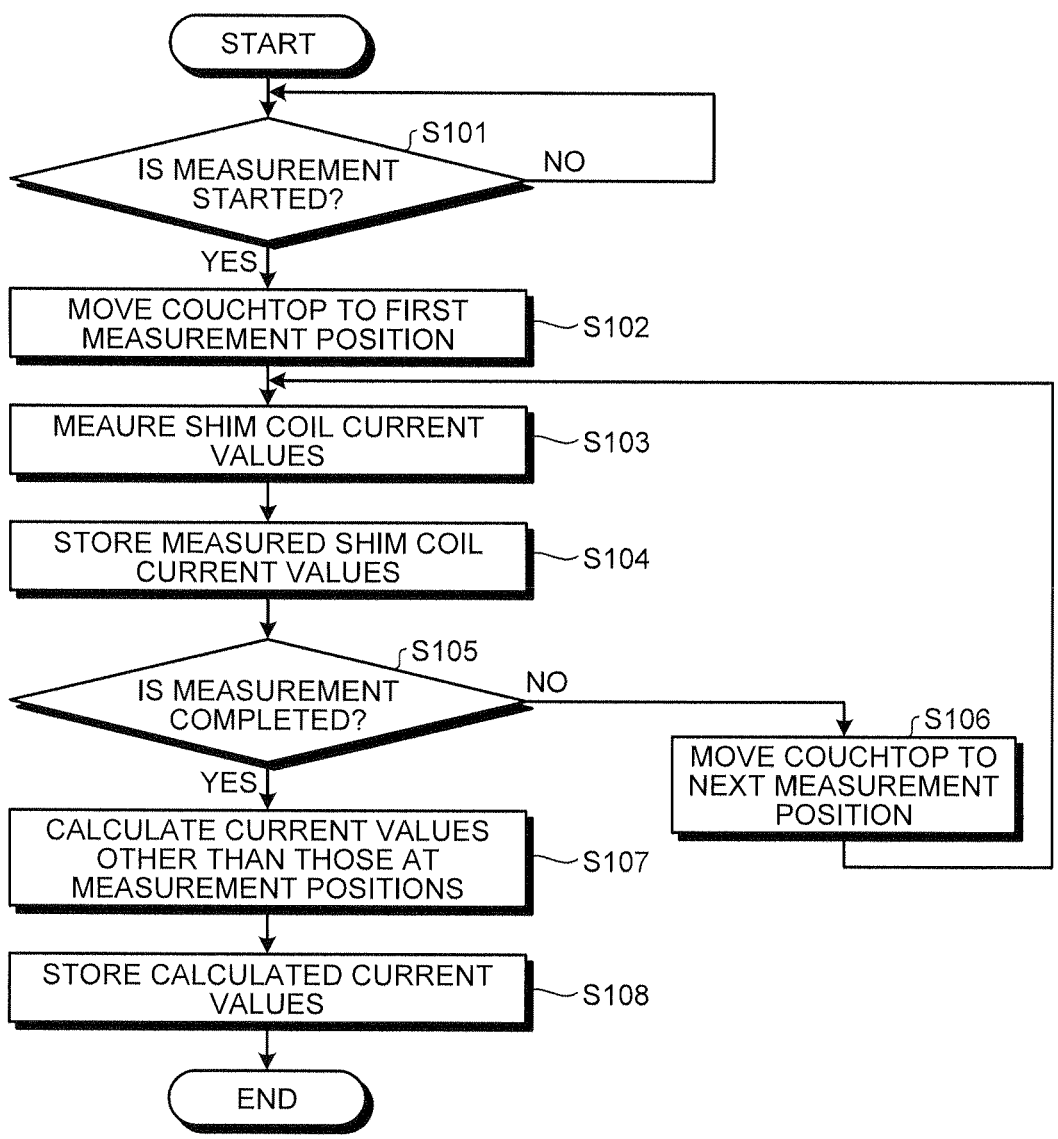
FIG. 6 is a flowchart of operations of the MRI apparatus to measure shim coil current values according to the embodiment.

Operations to measure shim coil current values will be described here. FIG. 6 is a flowchart of operations of the MRI apparatus 100 to measure shim coil current values according to the embodiment. As shown in FIG. 6, when shim coil current values are measured, the current value measuring unit 66c receives an instruction to start the measurement via the input unit 62 (S101).

Upon receiving the instruction to start the measurement (YES at step S101), the current value measuring unit 66c determines a position where shim coil current values are measured on the basis of the imaging conditions and then moves the couchtop 41 to the first measurement position (step S102). The current value measuring unit 66c uniformizes the static magnetic field and measures, for each shim channel, shim coil current values when the static magnetic field is uniformized (step S103). The current value measuring unit 66c then stores, in the shim coil current value storage unit 64b, the measured shim coil current values of the respective shim channels in association with the position information on the couchtop 41 (step S104).

Thereafter, when there is another measurement position where no shim coil current value has been measured (NO at step S105), the current value measuring unit 66c moves the couchtop 41 to the next measurement position (step S106) and measures again shim coil current values (step S103 and step S104). In this manner, the current value measuring unit 66c repeats the movement of the couchtop 41 and measures shim coil current values until measurement of shim coil current values at every measurement position is completed.

When measurement of shim coil current values at every measurement position is completed (YES at step S105), the current value measuring unit 66c calculates shim coil values at imaging positions other than the measurement positions (step S107). The current value measuring unit 66c then stores the calculated shim coil current values in the shim coil current value storage unit 64b (step S108) and ends processing regarding measurement of shim coil current values.

The operations performed to image the subject P will be described here. FIG. 7 is a flowchart of the operations performed by the MRI apparatus 100 according to the embodiment to image a subject. As shown in FIG. 7, when the subject is imaged, the imaging controller 66b receives an instruction to start imaging from the operator via the input unit 62 (step S201).

Upon receiving the instruction to start imaging (YES at step S201), the imaging controller 66b calculates a plurality of imaging positions on the basis of imaging conditions and then moves the couchtop 41 to the first imaging position (step S202). The current value measuring unit 66c refers to the shim coil current values stored in the shim coil current value storage unit 64b and determines shim coil current values corresponding to the position of the couchtop 41 (step S203).

The imaging controller 66b controls the sequence controller 30 and the shim controller 25 so as to acquire MR signal data while uniformizing the static magnetic field at each position of the couchtop 41 by supplying the shim coil unit 15 with the determined shim coil current values (step S204). The image reconstruction unit 65 reconstructs image data according to the acquired MR signal data (step S205).

When there is another imaging position at which imaging has not been performed (NO at step S206), the imaging controller 66b moves the couchtop 41 to the next imaging position (step S207), and then again exerts control so as to acquire MR image data and reconstruct an image (steps S203 to S205). In this manner, the imaging controller 66b repeats acquiring MR signal data and reconstructing images until imaging at every imaging position is completed. When imaging at every imaging position is completed (YES at step S206), the imaging controller 66b ends the processing regarding imaging of the subject P.

As described above, the MRI apparatus 100 according to the embodiment includes the static magnetic field magnet 11, the shim coil unit 15, the current value measuring unit 66c, the current value calculator 66d, and the imaging controller 66b. Before imaging, the current value measuring unit 66c moves the couchtop 41, on which the subject P lies, to at least one position of the plurality of positions in the imaging space and measures shim coil current values when the static magnetic field is uniformized by adjusting the shim coil current values supplied to the shim coil unit 15. On the basis of the shim coil current values measured by the current value measuring unit 66c, the current value calculator 66d calculates shim coil current values corresponding to a position where no shim coil current value has been measured by the current value measuring unit 66c. The imaging controller 66b performs imaging while uniformizing the static magnetic field at each position of the couchtop 41 by, while moving the couchtop 41 to a plurality of positions, supplying the shim coil unit 15 with, from among the shim coil current values measured by the current value measuring unit 66c and the shim coil current values calculated by the current value calculator 66d, shim coil current value corresponding to the position of the couchtop 41.

In other words, according to the embodiment, if shim coil current values are measured at least one position in an imaging space, shim coil values regarding another position can be interpolated according to the measured shim coil current values. Thus, it is unnecessary to measure shim coil current values regarding every position to which the couchtop is moved during imaging. Thus, according to the embodiment, it is possible, when imaging is performed while moving a subject, to shorten the time taken by imaging while correcting the non-uniformity of the static magnetic field. Because the time taken by imaging is shortened, the burden on the subject can be reduced and the throughput of the examination can be improved.

In the embodiment, the case is described where shim coil current values are measured at each position to which the couchtop 41 is moved. However embodiments are not limited to this. For example, shim coil values may be calculated for a plurality of positions within an imageable area at one position of the couchtop 41.

In the embodiment, the case is described where the couchtop 41 is gradually moved. However, embodiments are not limited to this. For example, embodiments can be carried out also in a case where imaging is performed while sequentially moving the couchtop 41. In this case, the area within which the couchtop 41 is moved is divided for each position stored in the shim coil current value storage unit 64b and the shim coil current values to be supplied to the shim coil unit 15 for each divided area are changed. This reduces image distortion resulting from non-uniformity of the static magnetic field.

In the above-described embodiments, examples are described where the current value calculator 66d calculates shim coil current values at a position where no measurement has been performed by calculating intermediate values between the shim coil current values regarding two adjacent positions or using various correction functions. Here, as another embodiment, a case will be described where the current value calculator 66d calculates shim coil current values at a position where no measurement has been performed by using a susceptibility function and a correction function.

In the embodiment, by using a susceptibility function representing a change in susceptibility in accordance with the anatomy of the subject, the current value calculator 66d calculates unmeasured shim coil current values according to the shim coil current values measured by the current value measuring unit 66c. The unmeasured shim coil current values are shim coil current values at a position where the current value measuring unit 66c has measured no shim coil current value.

It is known that non-uniformity of the magnetic field occurring because the subject enters the imaging space is due to magnetization of the subject. In other words, non-uniformity of the magnetic field increases if the susceptibility of the subject lying in the magnetic field is large and decreases if the susceptibility is low. Furthermore, the susceptibility of the subject (human body) relates to mainly the blood (iron) distribution. For example, susceptibility increases in an anatomy where a large volume of blood gathers, such as the lever. In other words, the susceptibility differs in each anatomy of the subject. Accordingly, the susceptibility of the magnetic field changes in accordance with the susceptibility of the anatomy positioned in the magnetic field and thus shim coil current values necessary to correct the magnetic field uniformity changes in accordance with the susceptibility of the anatomy positioned in the magnetic field. It can be supposed that there is a given correlation between shim coil current values and susceptibility. In other words, shim coil current values necessary to correct the magnetic field uniformity are obtained according to the susceptibility of the anatomy positioned in the magnetic field by using a given formula. Accordingly, in the embodiment, the current value calculator 66d calculates unmeasured shim coil current values by using susceptibility functions representing changes in the susceptibility corresponding to the anatomies on the subject.

FIG. 8 is a diagram illustrating a method of calculating shim coil current values performed by the current value calculator 66d according to the embodiment. Curves 71 to 75 shown in FIG. 8 represent changes in the susceptibility corresponding to the anatomies on the subject P. In FIG. 8, the horizontal axis denotes the position of the couchtop 41 along the direction in which the couchtop 41 moves (Z-axis direction) and the vertical axis denotes the magnitude of susceptibility. For example, the curve 71 represents a change in the susceptibility of the head. The curve 72 represents a change in the susceptibility of the chest. The curve 73 represents a change in the susceptibility of the abdomen. In addition, the curve 74 represents a change in the susceptibility of the upper extremity and the curve 75 represents a change in the susceptibility of the lower extremity. These curves are defined by specific susceptibility functions for the respective anatomies.

The current value calculator 66d refers to the shim coil current values stored in the shim coil current value storage unit 64b and identifies shim coil current values that have been measured and the measurement positions (e.g., the positions denoted by the solid-line arrow) where the shim coil current values have been measured. By using susceptibility functions of the anatomies corresponding to the identified measurement positions, the current value calculator 66d then calculates shim coil current values at a position where measurement has not been performed (e.g., the positions denoted by the dotted-line arrows) in the same anatomy according to the measured shim coil current values. By performing the same processing on the measured shim coil current values stored in the shim coil current value storage unit 64b, the current value calculator 66d calculates, for each anatomy, shim coil current values at every position where measurement has not been performed. In this manner, according to the shim coil current values measured by the current value measuring unit 66c, shim coil current values at positions where no measurement has been performed are interpolated.

It can be assumed that the blood distribution in the subject changes depending on the subject information and imaging conditions. For example, if the weight or height of the subject changes, the volume of blood and the blood distribution area change accordingly. Furthermore, for example, for the different sexes, builds change and accordingly the volume of blood or blood distribution areas change. Furthermore, for example, the blood distribution changes also depending on the posture of the subject and the direction in which the subject is inserted into the imaging space. For example, if the direction in which the subject is inserted is reversed, the blood distribution state is inverted in the direction in which the couchtop 41 moves.

Accordingly, the current value calculator 66d may correct a susceptibility function according to a correction function defined in accordance with at least one of the subject information and imaging conditions and may calculate, using the corrected susceptibility function, unmeasured shim coil current values according to the shim coil current values measured by the current value measuring unit 66c. The subject information includes, for example, weight, height, and sex of the subject. The imaging conditions include, for example, the posture of the subject and the direction in which the subject is inserted into the imaging space during imaging.

In this case, various correction functions are pre-defined in accordance with the subject information and the imaging conditions. For example, in FIG. 8, Curves 81, 82, and 83 denote correction functions in accordance with the weight of the subject P. Specifically, the curve 81 denotes a correction function for a case where the weight exceeds a given range, the curve 82 denotes a correction function for a case where the weight is within the given range, and the curve 83 denotes a correction function for a case where the weight is lower than the given range. In addition, for example, correction functions corresponding to the height or sex of the subject and the posture of the subject and the direction in which the subject is inserted to the imaging space are pre-defined. The values represented by the correction functions may be correction functions by which the susceptibility functions are multiplied or offset values to be added to the susceptibility functions.

For example, the current value calculator 66d acquires subject information input by the operator; chooses, from among correction functions defined in accordance with the subject information, a correction function corresponding to the acquired subject information; corrects the susceptibility function according to the chosen correction function; and calculates unmeasured shim coil current values. For example, subject information is input as a part of the imaging conditions set before imaging is performed.

The current value calculator 66d may acquire the subject information on the subject from another medical system; choose, from among the correction functions defined in accordance with the subject information, a correction function corresponding to the acquired subject information; correct the susceptibility function by using the chosen correction function; and calculate unmeasured shim coil current values. For example, when the MRI apparatus 100 is communicably connected to another medical system via a network, the current value calculator 66d acquires subject information from another system via the network. The medical system is, for example, a radiology information system (RIS), a hospital information system (HIS), and a picture archiving and communication systems (PACS).

In the above-described embodiment, the case is described where susceptibility functions are used. Alternatively, a table that stores correction values instead of correction functions may be used. In this case, for example, the storage unit 64 further includes a susceptibility storage unit that stores values of susceptibility corresponding to the anatomies on the subject. For example, the susceptibility storage unit stores a table associating the positions in the direction in which the couchtop 41 is moved and the values of susceptibility for each anatomy of the subject.

By using the susceptibility stored in the susceptibility storage unit, the current value calculator 66d calculates unmeasured shim coil current values according to the shim coil current values measured by the current value measuring unit 66c. First, the current value calculator 66d refers to the shim coil current values stored in the shim coil current value storage unit 64b and identifies the measured shim coil current values and the measurement position where the shim coil current values are measured. The current value calculator 66d then identifies to which anatomy the identified measurement value the identified measurement position corresponds and refers to the table corresponding to the identified anatomy. The current value calculator 66d then calculates shim coil current values at a position where no measurement has been performed according to the measured shim coil current value by using the relation between the susceptibility at the identified position and the susceptibility at the position where measurement has not been performed. By performing the same process on each of the measured shim coil current values stored in the shim coil current value storage unit 64b, the current value calculator 66d calculates shim coil current values at every position where no measurement has been performed for each anatomy. In this manner, according to the shim coil current values measured by the current value measuring unit 66c, the shim coil current values at the position where measurement has not been performed are interpolated.

Furthermore, for example, a table storing correction values instead of correction functions may be used. In this case, for example, the storage unit 64 further includes a correction value storage unit that stores correction values defined in accordance with at least one of the subject information and imaging conditions. For example, the correction value storage unit stores a table or a file associating anatomies on the subject and correction values. For example, the correction value storage unit stores a table or a file associating, for each anatomy of the subject, positions along the direction in which the couchtop 41 is moved and the correction values. The correction values may be correction coefficients with which the susceptibility is multiplied or offset values to be added to the susceptibility.

The current value calculator 66d corrects, for each anatomy, the susceptibility by using the correction values stored in the correction value storage unit and calculates, using the corrected susceptibility, unmeasured shim coil current values according to the shim coil current values measured by the current value measuring unit 66c.

In the embodiment, for example, the current value calculator 66d acquires subject information input by the operator; chooses a correction value corresponding to the obtained subject information from among the correction values stored in the correction value storage unit; corrects the susceptibility with the chosen correction value; and calculates unmeasured shim coil current values. Alternatively, the current value calculator 66d may acquire subject information on a subject from another medical system; choose a correction value corresponding to the acquired subject information from the correction values stored in the correction value storage unit; correct the susceptibility function with the chosen correction value; and calculate unmeasured shim coil current values.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
a static magnetic field generator configured to generate a static magnetic field in an imaging space;
a shim coil unit configured to generate a correction magnetic field that corrects non-uniformity of the static magnetic field;
a measuring unit configured to move a couchtop on which a subject is placed to a first position in the imaging space, and measure at least one first shim coil current value corresponding to the first position;
a calculator configured to calculate, on the basis of the at least one first shim coil current value and at least one of subject information and an imaging condition, at least one second shim coil current value corresponding to a second position in the imaging space; and
a controller configured to perform imaging, when the couchtop is placed at the second position, while uniformizing the static magnetic field by supplying the shim coil unit with the at least one second shim coil current value.

2. The magnetic resonance imaging apparatus according to claim 1, wherein the calculator is further configured to calculate the at least one second shim coil current value from the at least one first shim coil current value, by using a susceptibility function representing a susceptibility change corresponding to an anatomy of the subject.

3. The magnetic resonance imaging apparatus according to claim 2, wherein the subject information includes at least one of the weight, height, and sex of the subject.

4. The magnetic resonance imaging apparatus according to claim 2, wherein the imaging condition includes at least one of the posture of the subject and a direction in which the subject is inserted into the imaging space during imaging.

5. The magnetic resonance imaging apparatus according to claim 2, wherein the calculator is further configured to:
correct the susceptibility function with a correction function defined by at least one of the subject information and the imaging condition; and
calculate, by using the corrected susceptibility function, the at least one second shim coil current value from the at least one first shim coil current value.

6. The magnetic resonance imaging apparatus according to claim 5, wherein the subject information includes at least one of the weight, height, and sex of the subject.

7. The magnetic resonance imaging apparatus according to claim 5, wherein the imaging condition includes at least one of the posture of the subject and a direction in which the subject is inserted into the imaging space during imaging.

8. The magnetic resonance imaging apparatus according to claim 5, wherein the calculator is further configured to:
acquire subject information on the subject from another medical system;
choose, from among correction functions defined in accordance with the subject information, a correction function corresponding to the acquired subject information;
correct the susceptibility function with the chosen correction function; and
calculate, using the corrected susceptibility function, the at least one second shim coil current value.

9. The magnetic resonance imaging apparatus according to claim 8, wherein the imaging condition includes at least one of the posture of the subject and a direction in which the subject is inserted into the imaging space during imaging.

10. The magnetic resonance imaging apparatus according to claim 8, wherein the subject information includes at least one of the weight, height, and sex of the subject.

11. The magnetic resonance imaging apparatus according to claim 5, wherein the calculator is further configured to:
acquire subject information which is input by an operator;
choose, from among correction functions defined in accordance with the subject information, a correction function corresponding to the acquired subject information;
correct the susceptibility function with the chosen correction function; and
calculate, using the corrected susceptibility function, the at least one second shim coil current value.

12. The magnetic resonance imaging apparatus according to claim 11, wherein the subject information includes at least one of the weight, height, and sex of the subject.

13. The magnetic resonance imaging apparatus according to claim 11, wherein the imaging condition includes at least one of the posture of the subject and a direction in which the subject is inserted into the imaging space during imaging.

14. The magnetic resonance imaging apparatus according to claim 1, further comprising a susceptibility storage unit configured to store a value of susceptibility corresponding to an anatomy of the subject, wherein the calculator is further configured to calculate, by using the value of susceptibility stored in the susceptibility storage unit, the at least one second shim coil current value from the at least one first shim coil current value.

15. The magnetic resonance imaging apparatus according to claim 14, further comprising a correction value storage unit configured to store a correction value defined in accordance with at least one of the subject information and the imaging condition, wherein
the calculator is further configured to:
correct the susceptibility according to the correction value stored in the correction value storage unit; and
calculate, by using the corrected susceptibility, the at least one second shim coil current value from the at least one first shim coil current value.

16. The magnetic resonance imaging apparatus according to claim 15, wherein the calculator is further configured to:
acquire subject information which is input by an operator;

choose, from among correction values stored in the correction value storage unit, a correction value corresponding to the acquired subject information;

correct the susceptibility with the chosen correction value; and calculate, using the corrected susceptibility, the at least one second shim coil current value.

17. The magnetic resonance imaging apparatus according to claim 15, wherein the calculator is further configured to:

acquire subject information on the subject from another medical system;

choose, from among correction values stored in the correction value storage unit, a correction value corresponding to the acquired subject information;

correct the susceptibility function with the chosen correction value; and calculate, using the corrected susceptibility function, the at least one second shim coil current value.

18. The magnetic resonance imaging apparatus according to claim 14, wherein the subject information includes at least one of the weight, height, and sex of the subject.

19. The magnetic resonance imaging apparatus according to claim 1, wherein the subject information includes at least one of the weight, height, and sex of the subject.

20. The magnetic resonance imaging apparatus according to claim 1, wherein the imaging condition includes at least one of the posture of the subject and a direction in which the subject is inserted into the imaging space during imaging.

* * * * *